(12) United States Patent
Naito et al.

(10) Patent No.: US 7,969,636 B2
(45) Date of Patent: Jun. 28, 2011

(54) LASER DIRECT IMAGING APPARATUS

(75) Inventors: Yoshitatsu Naito, Ebina (JP); Yoshitada Oshida, Ebina (JP); Mitsuhiro Suzuki, Ebina (JP)

(73) Assignee: Hitachi Via Mechanics, Ltd., Ebina-shi (JP)

( * ) Notice: Subject to any disclaimer, the term of this patent is extended or adjusted under 35 U.S.C. 154(b) by 505 days.

(21) Appl. No.: 12/191,684

(22) Filed: Aug. 14, 2008

(65) Prior Publication Data
US 2009/0080047 A1 Mar. 26, 2009

(30) Foreign Application Priority Data

Sep. 20, 2007 (JP) ................................ 2007-244142

(51) Int. Cl.
*G02B 26/08* (2006.01)
(52) U.S. Cl. .................................................. 359/207.6
(58) Field of Classification Search .... 359/196.1–226.3; 250/204, 559.06, 559.29, 230, 234; 353/39, 353/98–99; 347/255–260
See application file for complete search history.

(56) References Cited

U.S. PATENT DOCUMENTS 4,131,113 A * 12/1978 Fender et al. ................. 600/558
4,407,571 A * 10/1983 Augusto et al. ............... 351/211

FOREIGN PATENT DOCUMENTS

JP 2007-94122 A 4/2007

* cited by examiner

*Primary Examiner* — Stephone B Allen
*Assistant Examiner* — Jennifer L. Doak
(74) *Attorney, Agent, or Firm* — Crowell & Moring LLP

(57) ABSTRACT

A laser direct imaging apparatus which can expose photosensitive materials having various sensitivities and which can correct an imaging position in accordance with deformation of a workpiece. In the laser direct imaging apparatus, the workpiece is moved in a sub-scanning direction while a cylindrical lens is used to converge a laser beam, which has been modulated based on raster data, in the sub-scanning direction and deflect the laser beam toward a main scanning direction so as to image a desired pattern on the workpiece. The cylindrical axis of the cylindrical lens is designed to be able to rotate horizontally and to be able to change an angle with respect to the main scanning direction.

2 Claims, 6 Drawing Sheets

PORTION A

SUB-SCANNING
DIRECTION

LASER DIRECT IMAGING APPARATUS

FIELD OF THE INVENTION

The present invention relates to a laser direct imaging (LDI) apparatus for moving a workpiece in a sub-scanning direction while using a cylindrical lens to condense a laser beam, which has been modulated based on raster data, in the sub-scanning direction and deflect the laser beam toward a main scanning direction so as to image a desired pattern on the workpiece.

BACKGROUND OF THE INVENTION

In an LDI apparatus, CAD data used for designing a circuit pattern are converted into vector data format, and then contours are calculated from the vector data. After that, the contours are further converted into raster data for imaging. From the raster data, ON and OFF pixels for a laser beam are obtained. The ON pixels are irradiated with the laser beam.

FIG. 7 is a view showing a configuration of background-art LDI apparatus.

A laser source 1 is mounted on an optical table 16. The optical table 16 is disposed on a column 17 on a bed 18. A laser beam 5 emitted from the laser source 1 enters an acousto-optic modulator (hereinafter referred to as "AOM") 4 reflected by mirrors 2 and an expander 3. A laser beam 5a modulated by the AOM 4 is deflected by a polygon mirror 6 and enters an fθ lens 7. The laser beam 5a emerged from the fθ lens 7 is deflected toward the downward direction of FIG. 7 by a reflection mirror 8, and enters a cylindrical lens 9. The laser beam 5a emerged from the cylindrical lens 9 is incident on a workpiece 10. A dry film resist (hereinafter referred to as "DFR"), a photo-resist or the like on the workpiece 10 is exposed to the laser beam 5a. On this occasion, a table 12 where the workpiece 10 is mounted moves in a sub-scanning direction (Y-axis direction in FIG. 7. The X-axis direction in FIG. 7 is a main scanning direction.) at a constant speed. A linear motor 14 moves the table 12. A pair of guides 13 guide the table 12 (Patent Document 1).

Here, the anterior focal point of the fθ lens 7 is positioned on the reflection plane of the polygon mirror 6. Of the laser beam 5 reflected by the polygon mirror 6, components parallel to the XY plane are parallel rays, and components perpendicular to the XY plane are divergent rays starting at a reflection point of the polygon mirror 6. Accordingly, the components of the laser beam 5 parallel to the XY plane are converged by the fθ lens 7 but passed through the cylindrical lens 9 as they are. On the other hand, the components of the laser beam 5 perpendicular to the XY plane are converted into parallel rays by the fθ lens 7, and converged by the cylindrical lens 9.

FIGS. 8A and 8B are views showing the position of a start sensor. FIG. 8A is a view in the X-axis direction of FIG. 7, and FIG. 8B is a view in the Y-axis direction of FIG. 7.

A mirror 11 is disposed under the left end portion of the cylindrical lens 9 in FIG. 7. A start sensor 15 is disposed in the direction of reflected laser beam from the mirror 11. In order to align the imaging start positions of rows, which mean the rows of the exposed pixels by the main scanning (X-axis direction), imaging in each scan in the main scanning direction is started when a predetermined time has passed after the start sensor 15 has detected the laser beam 5a reflected by the mirror 11 (the distance between the detection position and the imaging start position is 10 mm in the illustrated case).

The table 12 on which the workpiece 10 is mounted moves in the sub-scanning direction when the laser beam is scanning in the main scanning direction. Accordingly, when the laser beam 5 is scanned in the X direction, the scanning line by irradiation (exposure) with the laser beam 5 tilts clockwise at an angle α with respect to the X direction (main scanning direction) as shown in FIG. 9. The angle α will be referred to as "scanning angle".

In the background art, therefore, an irradiation optics is disposed so that the scanning angle α is set to 0 with respect to the moving direction of the table 12, and an irradiation system is disposed so that the scanning line of exposure is perpendicular to the Y direction (sub-scanning direction).

Patent Document 1: JP-A-2007-94122

If the sensitivity of a photosensitive material to light (hereinafter referred to as "sensitivity" simply) is uniform, the scanning angle α can be made constant. However, some DFR (Dry Film Resist) may have a variation in its resist sensitivity. For example, assume that the output of a laser is constant, and the resist sensitivity is 50 mJ/cm$^2$. In this case, the scanning speed of the laser beam (the number of revolutions of the polygon mirror) and the moving speed of the table must be made ⅕ of that when the resist sensitivity is 10 mJ/cm$^2$.

However, the polygon mirror has a narrow range of stable revolution speed (which is, for example, as wide as or ½ as wide as the rated revolution speed). Accordingly, the range of possible scanning angle α is so narrow that the workpieces which can be exposed are limited in variety.

SUMMARY OF THE INVENTION

An object of the present invention is to solve the foregoing problem. Another object of the present invention is to provide a laser direct imaging apparatus which can expose photosensitive materials having various sensitivities and which can correct an imaging position in accordance with deformation of a workpiece.

In order to attain the foregoing objects, the present invention provides a laser direct imaging apparatus for moving a workpiece in a sub-scanning direction while using a cylindrical lens to converge a laser beam, which has been modulated based on raster data, in the sub-scanning direction and deflect the laser beam toward a main scanning direction so as to image a desired pattern on the workpiece. The laser direct imaging apparatus is characterized in that the cylindrical axis of the cylindrical lens is designed to be able to rotate horizontally and to be able to change an angle with respect to the main scanning direction.

In this case, the axis of rotation of the cylindrical lens may be brought into line with a imaging start point of the laser beam.

The angle (scanning angle α) of the cylindrical axis of the cylindrical lens with respect to the main scanning direction can be set easier. Accordingly, photosensitive materials having various sensitivities can be exposed.

DETAILED DESCRIPTION OF THE EMBODIMENTS

The present invention will be described below with reference to the drawings.

Figures 1A, 1B:
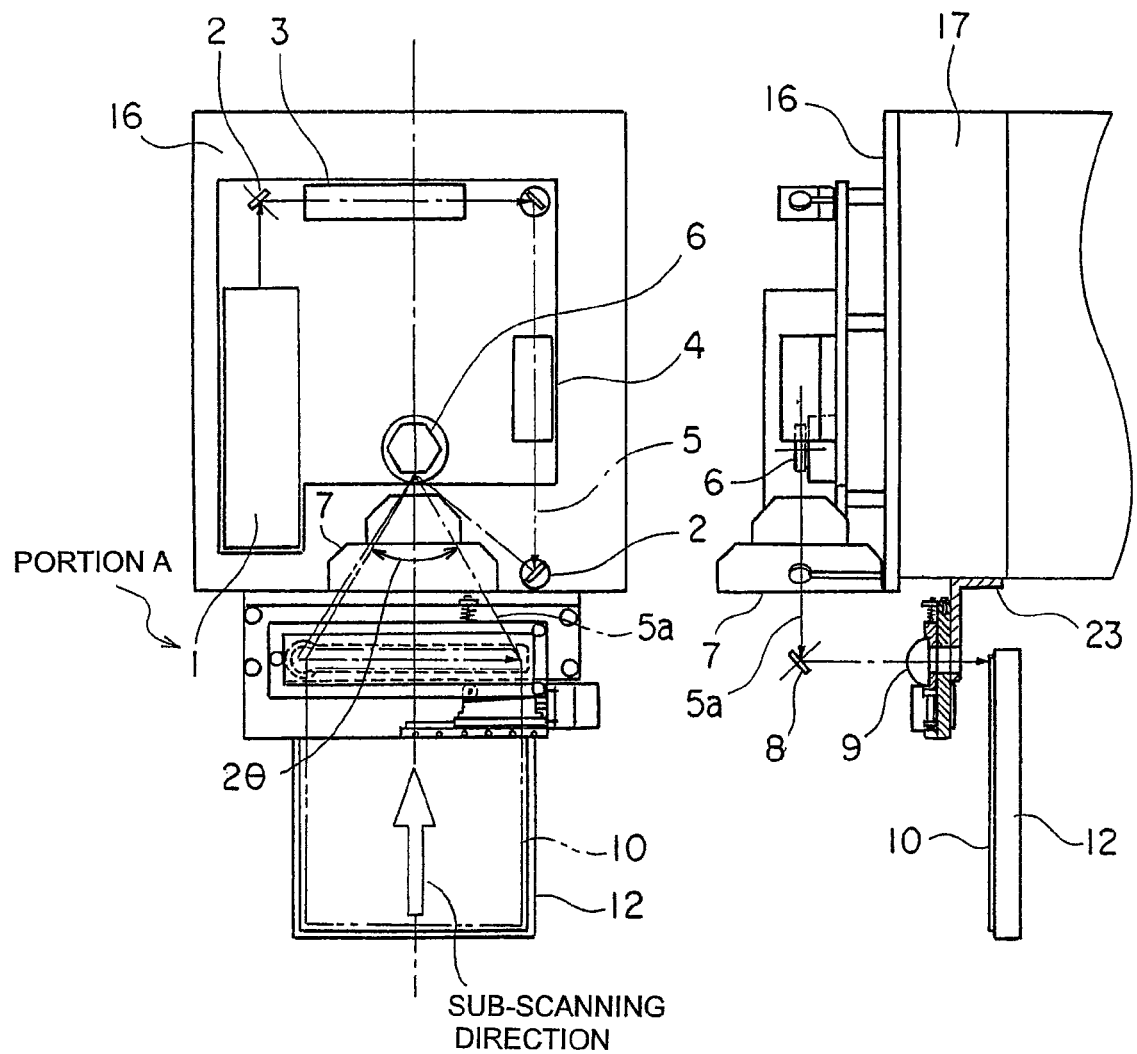
FIGS. 1A and 1B are views showing a configuration of a laser direct imaging apparatus according to the present invention.
Figure 2A:
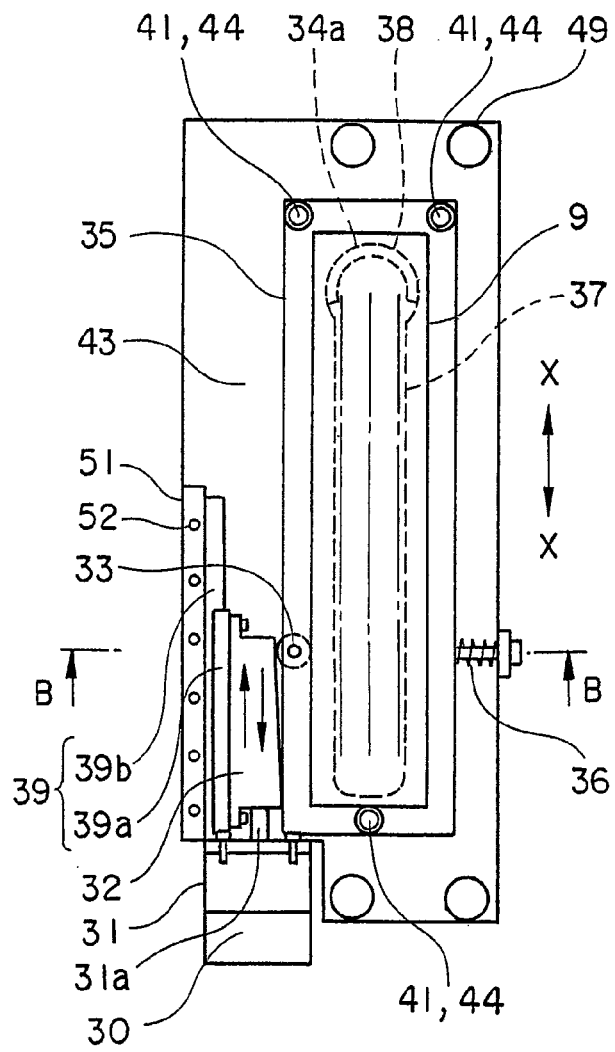
FIGS. 2A and 2B are enlarged fragmentary views of a portion A in FIG. 1A.
Figure 2B:
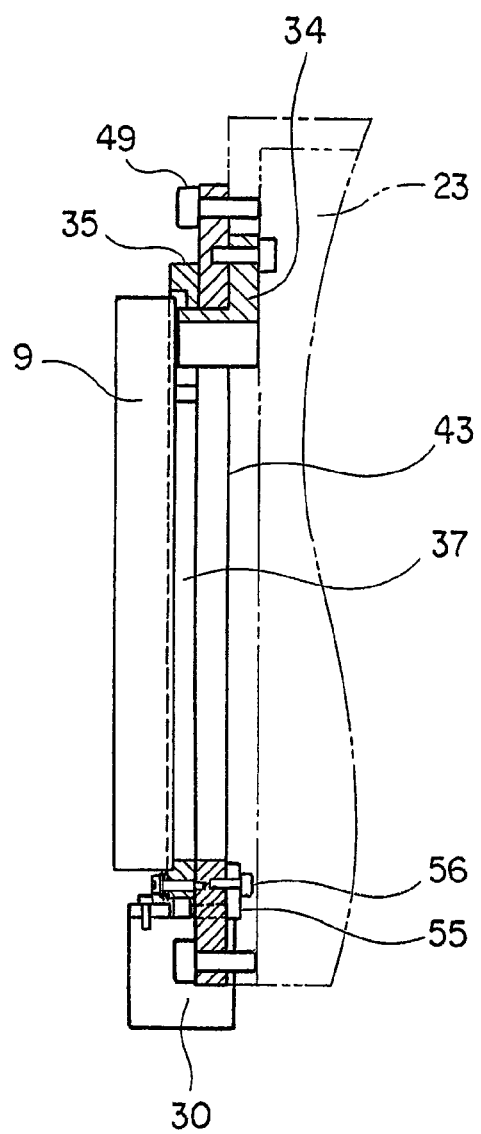
Figure 3:
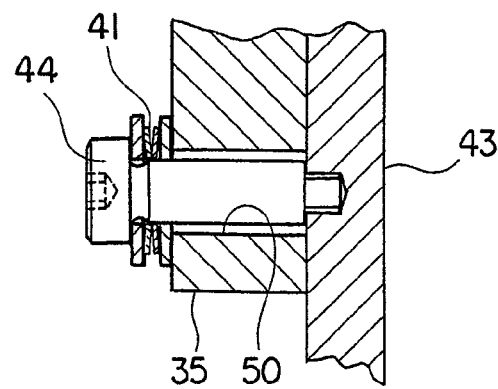
FIG. 3 is a fragmentary sectional view of a main portion of the laser direct imaging apparatus according to the present invention.
Figure 4:
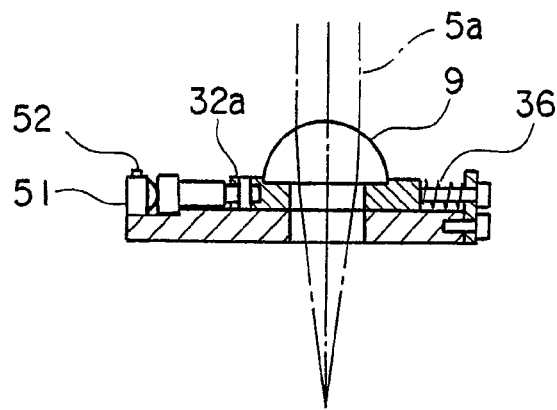
FIG. 4 is a sectional view taken on the line B-B in FIG. 2A.
Figure 7:
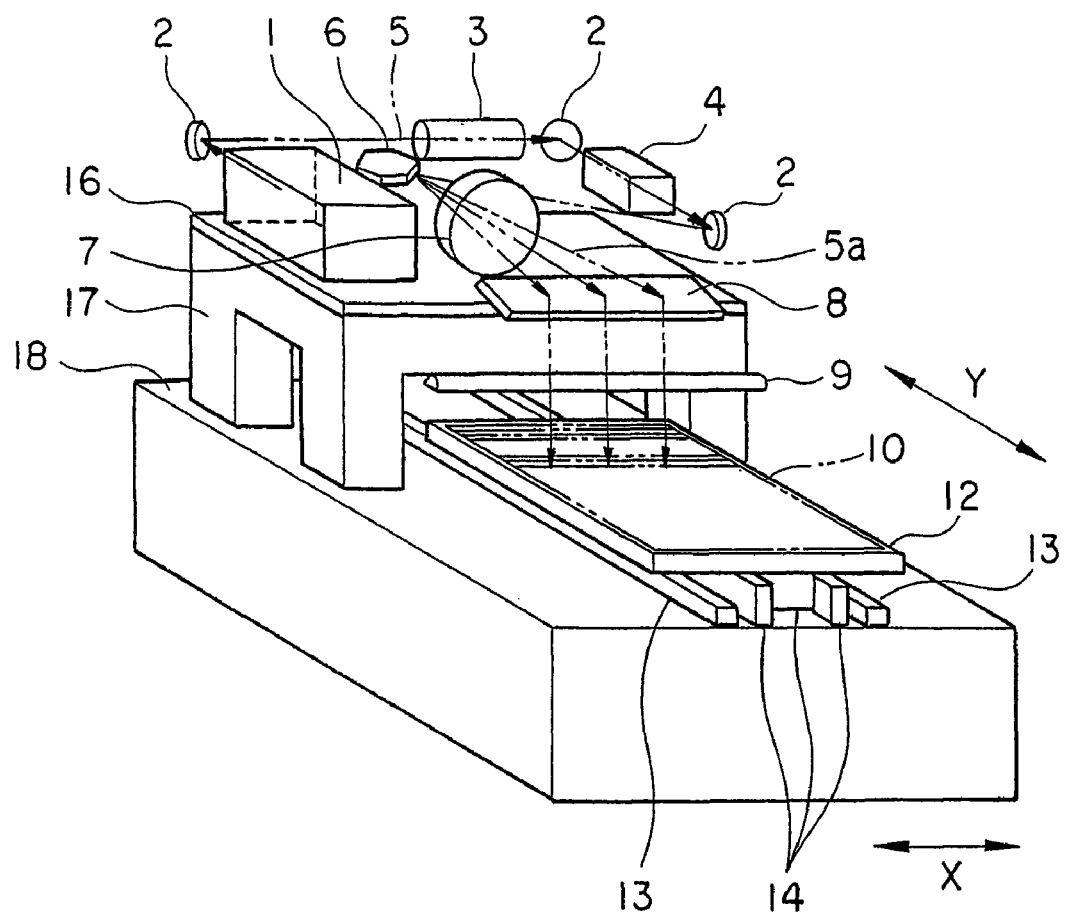
FIG. 7 is a view showing a configuration of a background-art laser direct imaging apparatus.
Figure 8A:
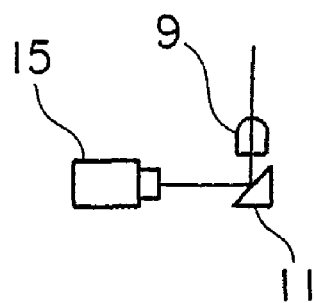
FIGS. 8A and 8B are diagrams for explaining the background-art laser direct imaging apparatus.
Figure 8B:
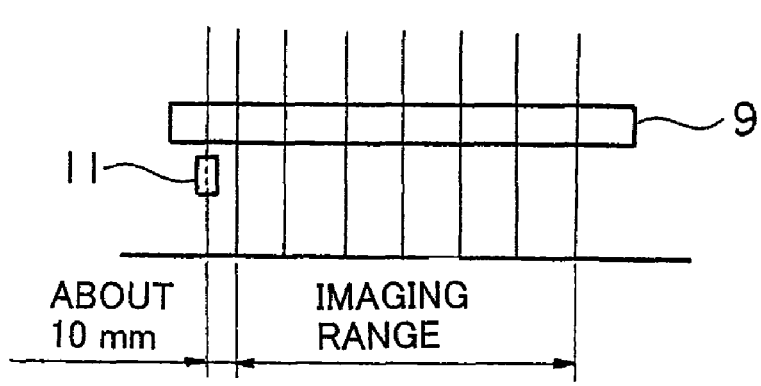
Figure 9:
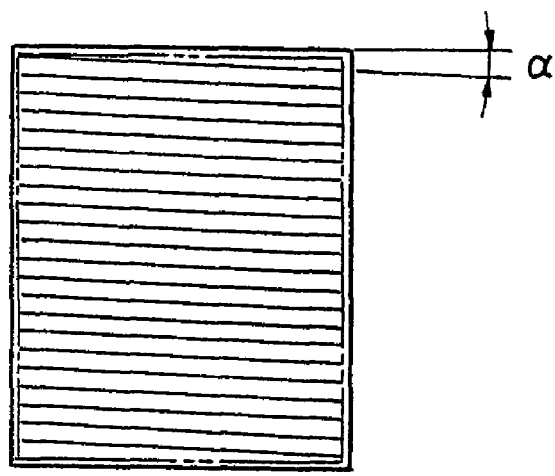
FIG. 9 is a diagram for explaining a scanning angle.

FIGS. 1A and 1B are views showing a configuration of a laser direct imaging apparatus according to the present invention. FIG. 1A is a plan view, and FIG. 1B is a side view. FIGS. 2A and 2B are enlarged fragmentary view of a portion A in FIG. 1A. FIG. 2A is a plan view, and FIG. 2B is a side view. For convenience of representation, FIGS. 2A and 2B show the state where the same as that in FIGS. 1A and 1B has been rotated at an angle of 90°. FIG. 3 is a fragmentary sectional view of the vicinities of a pin 44 which will be described later. FIG. 4 is a sectional view taken on the line B-B in FIG. 2A. Parts the same as or having the same functions as those in FIG. 7 are designated with the same reference numeral and a description thereof is omitted.

A bracket 23 is fixed to a column 17. A base plate 43 is fixed onto the bracket 23 by bolts 49. A hollow hinge pin 34 has a hollow horseshoe boss portion 34a. The boss portion 34a is annular and partially notched. The hollow hinge pin 34 is fixed to the base plate 43. The center of the boss portion 34a is positioned above an imaging start point so that the axis of rotation of a cylindrical lens 9 passes through both the center and the imaging start point. As will be described later, the reason why the boss portion 34a is notched is to prevent the boss portion 34a from interfering with a laser beam 5a emerged from the cylindrical lens 9. The inside radius of the boss portion 34a is a radius (here, 15 mm) large enough not to block the laser beam 5a.

The cylindrical lens 9 is supported on a lens holder 35. A circular portion 38 provided in the lens holder 35 is fitted to the outer circumference of the boss portion 34a so as to allow the cylindrical axis of the cylindrical lens 9 to pass through the center of boss portion 34a. Accordingly, the lens holder 35, that is, the cylindrical lens 9 can be positioned desirably near and around the center of the boss portion 34a, that is, the imaging start point. A hole 37 and three holes 50 are formed in the lens holder 35. The hole 37 is formed to be large enough to allow the lens holder 35 to rotate without blocking the laser beam 5a emerged from the cylindrical lens 9.

As shown in FIG. 3, pins 44 are screwed down to the base plate 43 through the holes 50 respectively. Belleville springs 41 press the lens holder 35 against the base plate 43 so as to prevent the lens holder 35 from moving up from the base plate 43. The pressure force of the Belleville springs 41 is too weak for the lens holder 35 to rotate around the axis passing through the imaging start point. The outer diameter of each pin 44 is smaller than the diameter of each hole 50, so that the lens holder 35 can rotate around the axis passing through the imaging start point.

A cam follower 33 is rotatably supported on one side surface of the lens holder 35. A linear guide unit 39 constituted by a bearing 39a and a track 39b is disposed on the base plate 43. The track 39b is fixed to a holder 51 so as to guide the bearing 39a in the X direction. The holder 51 is fixed to the base plate 43 by bolts 52. A linear cam 32 is fixed to the bearing 39a. An end surface of the linear cam 32 facing the cam follower 33 is tapered with its thick end placed downward in FIG. 2A.

The linear cam 32 is connected to a shaft 31a of a linear actuator 31. A motor 30 drives the linear actuator 31 so as to move the shaft 31a in the X direction. The motor 30 is fixed to the base plate 43 with an L-shaped support 55. A bolt 56 fixes the support 55 to the base plate 43.

A spring 36 presses the lens holder 35 to the left in FIG. 2A so as to bring the cam follower 33 into contact with a face 32a of the linear cam 32 opposed thereto.

With the configuration mentioned thus, the linear cam 32 moves in the X direction when the motor 30 is rotated. The lens holder 35 rotates around the axis passing through the imaging start point (that is, the value of the scanning angle α increases and decreases) with the X-direction motion of the cam follower 33 in contact with the linear cam 32. Then, the guide 39 is positioned to set the scanning angle α to a desired value.

Next, the operation of the present invention will be described.

First, description will be made about the scanning angle α.

When the rotational speed+ of a polygon mirror is N [rpm] and the number of facets thereof is m, scanning time tm on every one facet of the polygon mirror and scanning time ts through a deflection angle 2θ [degrees] can be expressed by Equations 1 and 2.

$$tm = 60/N/m \ [s] \quad \text{(Equation 1)}$$

$$ts = tm \times \theta/(360/m) \ [s] \quad \text{(Equation 2)}$$

When the deflection angle of the polygon mirror is θ, the maximum incident angle of the laser beam 5a incident on an fθ lens 7 is θ. When f designates the focal length of the fθ lens 7 and V designates the feed speed of a table (exposure speed), the scanning angle α can be expressed by Equation 3.

$$\alpha = \tan^{-1}(ts \times V/(2 \times f \times \theta)) \quad \text{(Equation 3)}$$

where the angle θ is converted to radians.

Figure 5:
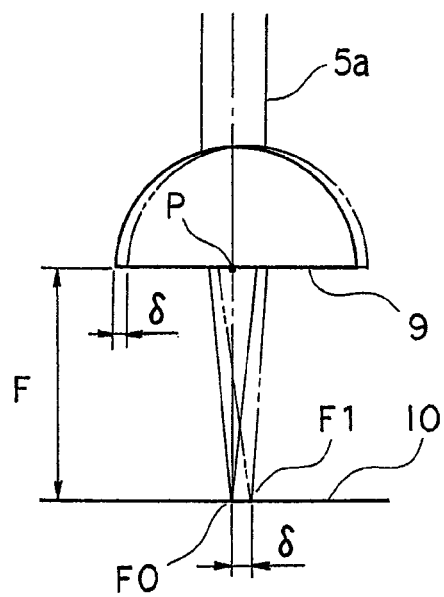
FIG. 5 is a sectional view perpendicular to the cylindrical axis of a cylindrical lens.

FIG. 5 is a sectional view perpendicular to the cylindrical axis of the cylindrical lens 9. The reference sign P represents the cylindrical axis of the cylindrical lens 9.

As described previously, of the laser beam 5a incident on the cylindrical lens 9, the component in the width direction of the cylindrical lens 9 is collimated. Accordingly, when the central axis of the laser beam 5a incident on the cylindrical lens 9 perpendicularly thereto passes through the axis P, the laser beam 5a is converged to a position F0 which is at a distance F (F designates the focal length of the cylindrical lens 9) from the axis P. Here, assume that the cylindrical lens 9 is moved to the right in FIG. 5 by a distance δ (that is, the axis P is moved to the right in FIG. 5 by the distance δ) as shown by the alternately long- and double short-dashed line in FIG. 5 while the central axis of the laser beam 5a is fixed. In this case, the laser beam 5a is converged to a position F1 which is δ on the right of the position F in FIG. 5. That is, though the central axis of the laser beam 5a is on the same, the position where the laser beam 5a is converged is shifted by a distance with which the position of the axis P of the cylindrical lens 9 is shifted in parallel to the surface of a workpiece 10. To say other words, when the axis P of the cylindrical lens 9 is tilted at an angle α with respect to the running direction of the workpiece, the position where the laser beam 5a is condensed is also tilted at the angle α with respect to the running direction. It is therefore possible to set the scanning angle as an angle of the axis P of the cylindrical lens 9 with respect to the scanning direction.

In this embodiment, the cylindrical lens 9 is rotated around the axis passing through the imaging start point. Accordingly, there is no fear that the imaging start point is shifted in the X direction. It is therefore possible to perform imaging with high quality.

Figure 6A:
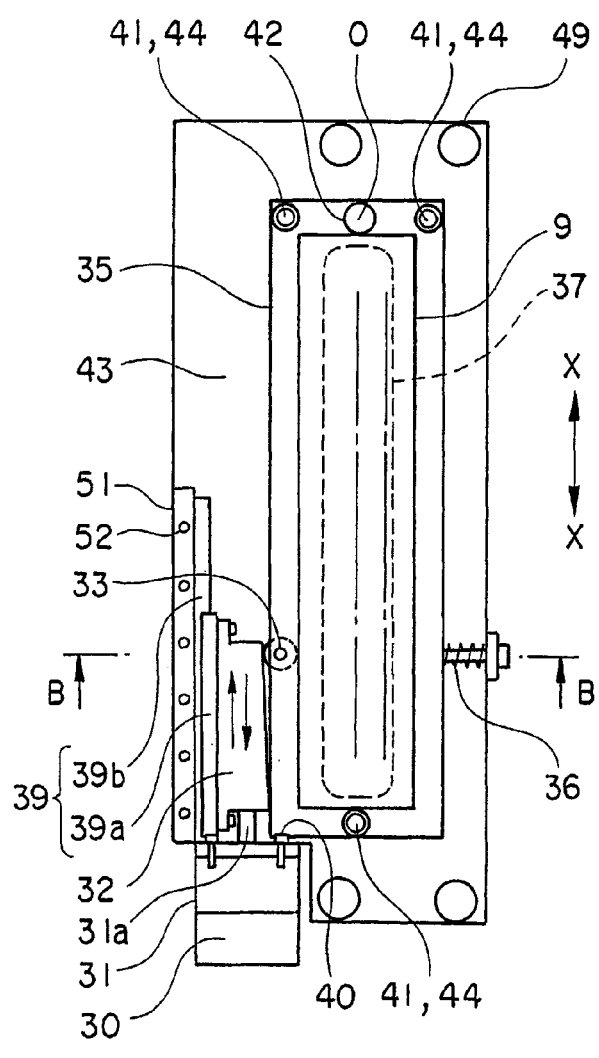
FIGS. 6A and 6B are views showing a modification of the present invention.
Figure 6B:
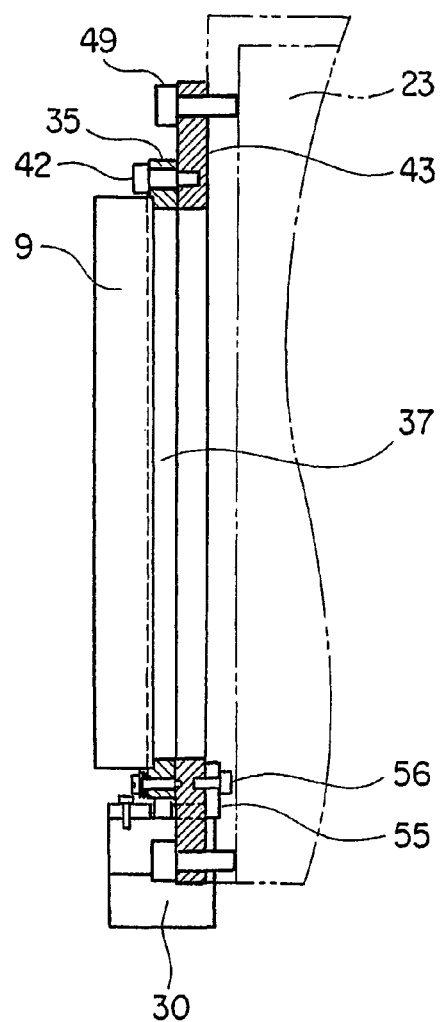

FIGS. 6A and 6B are views showing a modification of the present invention.

The lens holder 35 is disposed on the base plate 43 so that the lens holder 35 can rotate around a hinge pin 42.

According to this modification, the axis of the hinge pin 42 does not pass through the imaging start point. Therefore, the imaging start point is shifted in the Y direction by a distance tan α. However, the scanning angle α can be known in advance. When the position where the workpiece 10 is placed on the table is shifted in the Y direction by the distance tan α, an image can be drawn in a desired position of the workpiece.

The operation in this embodiment is substantially the same as that in the aforementioned embodiment. Therefore, redundant description will be omitted.

Although a laser beam is modulated by an AOM in the aforementioned embodiments, the present invention can be also applied to a laser direct imaging apparatus in which a laser diode is used as a light source, and the laser diode is ON/OFF-controlled directly.

What is claimed is:

1. A laser direct imaging apparatus for moving a workpiece in a sub-scanning direction while using a cylindrical lens to converge a laser beam, which has been modulated based on raster data, in the sub-scanning direction and deflect the laser beam toward a main scanning direction so as to image a desired pattern on the workpiece, the laser direct imaging apparatus comprising:

means for allowing an cylindrical axis of the cylindrical lens to rotate in parallel to a surface of the workpiece; and means for allowing the cylindrical axis of the cylindrical lens to change an angle with respect to the main scanning direction.

2. A laser direct imaging apparatus according to claim 1, wherein an axis of rotation of the cylindrical lens passes through a imaging start point of the laser beam.

* * * * *